United States Patent
Reynes et al.

(10) Patent No.: US 8,018,018 B2
(45) Date of Patent: Sep. 13, 2011

(54) TEMPERATURE SENSING DEVICE

(75) Inventors: Jean-Michel Reynes, Pompertuzat (FR); Eric Marty, Toulouse (FR); Alain Deram, Colomiers (FR); Jean-Baptiste Sauveplane, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 702 days.

(21) Appl. No.: 11/995,465

(22) PCT Filed: Jul. 10, 2006

(86) PCT No.: PCT/IB2006/003401
§ 371 (c)(1),
(2), (4) Date: Aug. 11, 2008

(87) PCT Pub. No.: WO2007/020538
PCT Pub. Date: Feb. 22, 2007

(65) Prior Publication Data
US 2008/0283955 A1 Nov. 20, 2008

(30) Foreign Application Priority Data

Jul. 13, 2005 (WO) .................. PCT/EP2005/009174

(51) Int. Cl.
*H01L 31/04* (2006.01)
*H01L 21/00* (2006.01)
(52) U.S. Cl. .................... 257/467; 257/E23.08; 438/54; 374/178
(58) Field of Classification Search .................. 257/467, 257/470, E23.08; 438/54; 374/178, E7.035
See application file for complete search history.

(56) References Cited

U.S. PATENT DOCUMENTS

| 4,896,199 A | 1/1990 | Tsuzuki et al. |
| 5,049,961 A | 9/1991 | Zommer et al. |
| 5,100,829 A | 3/1992 | Fay et al. |
| 6,133,616 A | 10/2000 | Sobhani et al. |
| 6,906,399 B2 | 6/2005 | Fruth et al. |
| 7,462,922 B2 * | 12/2008 | Mori et al. .................... 257/470 |

FOREIGN PATENT DOCUMENTS

| EP | 0641024 B1 | 4/1998 |
| WO | 97/02592 A2 | 1/1997 |
| WO | 2007/006337 A1 | 1/2007 |

* cited by examiner

*Primary Examiner* — David Vu
*Assistant Examiner* — Earl N Taylor (57) ABSTRACT

The present invention relates to an integrated device, comprising a semiconductor device formed on a semiconductor substrate, a temperature sensing element formed within a semi-conductive layer formed on the semiconductor substrate, an electrically insulating layer formed over the semi-conductive layer, a metal layer formed over the insulation layer and forming an electrical contact of the semiconductor device, and a thermal contact extending from the metal layer through the electrically insulating layer to a first region of the semi-conductive layer, wherein the first region of the semi-conductive layer is electrically isolated from the temperature sensing element. The present invention also relates to a method of forming a temperature sensing element for integration with a semiconductor device.

17 Claims, 11 Drawing Sheets

TEMPERATURE SENSING DEVICE

FIELD OF THE INVENTION

This invention relates to a semiconductor device having an integrated temperature sensing device. The invention also relates to a method of manufacturing a temperature sensing device for integration with a semiconductor device.

BACKGROUND OF THE INVENTION

It is well known to include temperature sensing devices, such as diodes, with semiconductor devices, and especially power semiconductor devices. For example, the use of a diode, integrated with a power MOSFET device, to sense the temperature of the power MOSFET while it is in use is well known. In this case, the forward voltage of the diode is proportional to the temperature of the diode and so by monitoring the forward voltage across a diode integrated with the power device, the temperature of the power device can be monitored. This is useful, for example, when tracking the device's temperature during operation to enable the device to be safely and rapidly shutdown in case of emergency, for example due to a high inrush current caused by a faulty load.

Traditionally, such temperature sensing diodes are located nearest the heat generating portion of the semiconductor device, and as a result can impact the performance of such devices, for example, by reducing specific turn on resistances of these devices. Accordingly, there is a desire to manufacture an improved semiconductor device with an integrated temperature sensing device.

Furthermore, there is a desire to manufacture an improved diode for integration with a semiconductor device.

SUMMARY OF THE INVENTION

The present invention provides an integrated device as set out in claim 1, and a method of forming a temperature sensing element for integration with a semiconductor device as set out in claim 8.

BRIEF DESCRIPTION OF THE DRAWINGS

A semiconductor device having an integrated temperature sensing element, and a method of manufacturing a temperature sensing element for integration with a semiconductor device will now be described, by way of example only, with reference to the accompanying drawings in which.

DETAILED DESCRIPTION OF THE PREFERRED EMBODIMENTS

In the specific embodiment, the temperature sensing device is a forward biased diode. The invention is not limited to a temperature sensing diode and may be used with other temperature sensing elements.

A method of forming a single diode in accordance with the present invention for integration with a semiconductor device will now be described with reference to FIGS. 1-11. To avoid complexity, the details of the semiconductor device have been omitted from FIGS. 1-11. It will be appreciated that the steps used in the following process may be used in conjunction with and as part of the process operations for the fabrication of the rest of the semiconductor device, such as the electrically isolating reversed bias diode. It will also be appreciated that the present invention may be used with any semiconductor device requiring an integrated temperature sensing diode e.g. IGBT devices.

Although in the following description the layers and regions will be described as having certain conductivity types and being comprised of certain materials, this is for illustrative purposes only. It is not intended that the invention be limited to the specific conductivity types or the specific materials referred to herein.

Figure 1:
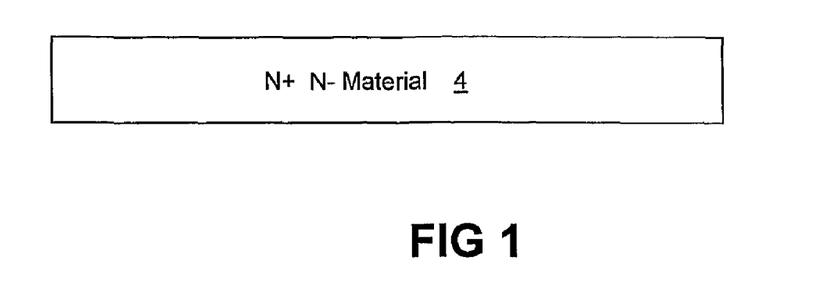
FIGS. 1-11 show simplified schematic cross-sectional diagrams of a temperature sensing diode during various stages of fabrication, in accordance with the present invention.

Referring firstly to FIG. 1, a layer 4 of semiconductor material (the substrate), which is preferably an N conductivity type epitaxial layer, is provided.

Figure 2:
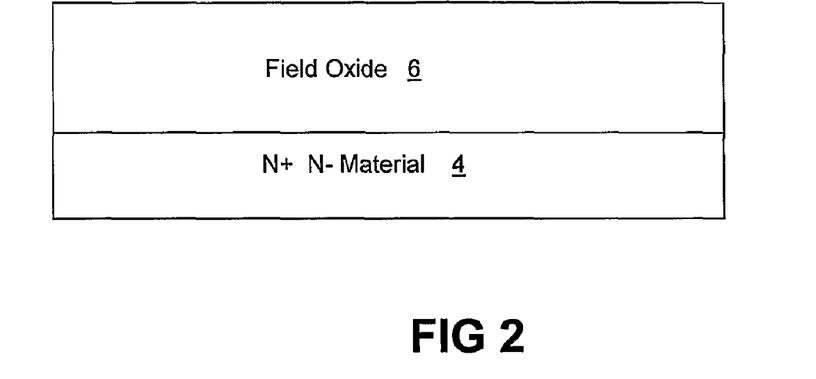

As shown in FIG. 2, a dielectric layer 6 is then formed over the epitaxial layer 4, as is well know in the art. In the preferred embodiment, the dielectric layer 6 is an oxide layer having a thickness of 0.6 microns.

Figure 3:
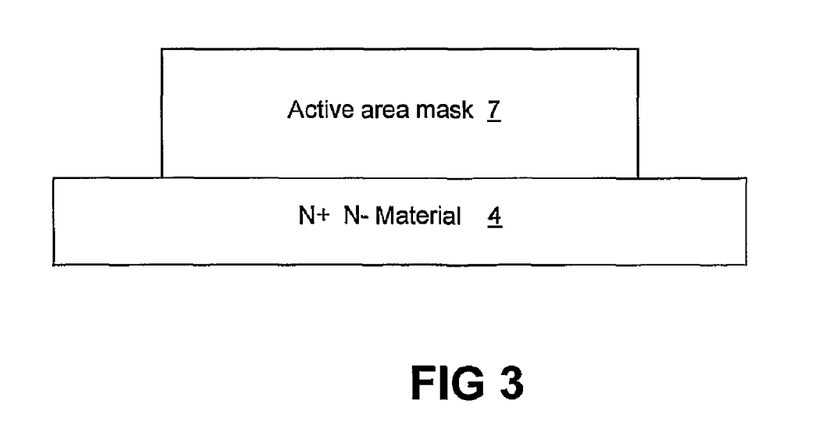

Next, as shown in FIG. 3, the active area 7 of the diode is masked off, and the oxide layer 6 is etched to leave the active area 7 only, as is also well known in the art.

The device is then blanket covered with a semi-conductive layer 8 formed over both the N conductivity type epitaxial layer 4 and the active area 7 formed from the dielectric layer. Preferably, the semi-conductive layer 8 is a layer of lightly doped, N− polysilicon material or oxygen doped polycrystalline silicon (SIPOS) material deposited on the dielectric 6 and epitaxial 4 layers, by standard deposition techniques, such as Low Pressure Chemical Vapour Deposition (LPCVD).

Figure 4:
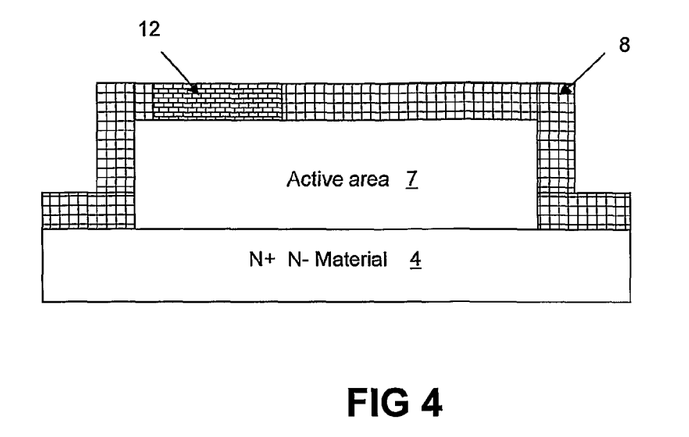

Next, a first P+ region 12 of the PN junction is formed, using a standard mask and implant step in which a P conductivity type dopant is introduced into the semi-conductive layer 8, for example, by implantation of boron B11 or boron difluoride BF2 or any other suitable P-type dopant. The implantation parameters are selected such that the concentration of P conductivity type dopant in the first region 12 of the polycrystalline semi-conductive layer 8 is sufficient to ensure a good ohmic contact between the P doped first region 12 and the diode contact subsequently formed on this region. This is typically at least 1 E18 atoms per $cm^3$. The result of this process step is shown in FIG. 4.

Figure 5:
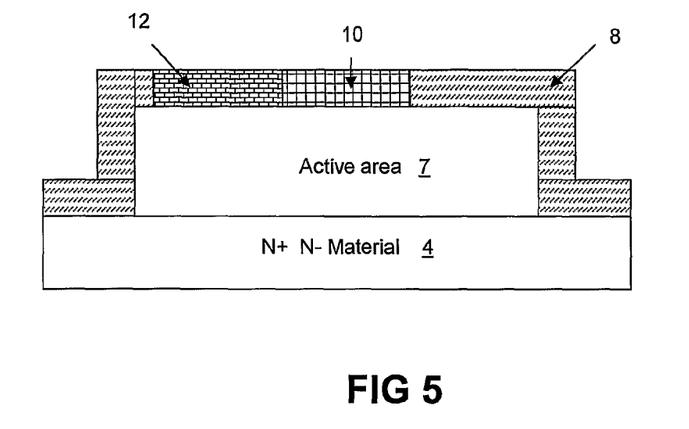

Next, another mask and implantation step is performed, however this time it is to form the second N+ region of the PN junction. This is carried out by masking off the already implanted P+ region 12 and a portion of the lightly doped N– region 10, and then implanting an N conductivity type dopant into the polycrystalline semi-conductive layer 8, for example, by implantation of phosphorous, arsenic or other N conductivity type dopant. The implantation parameters are selected such that the concentration of N conductivity type dopant in the second region 14 of the polycrystalline semi-conductive layer 8 is sufficient to also ensure a good ohmic contact between the N doped second region 14 and a diode contact. This is typically around 5-6 E19 atoms per $cm^3$. The result is shown in FIG. 5.

Figure 6:
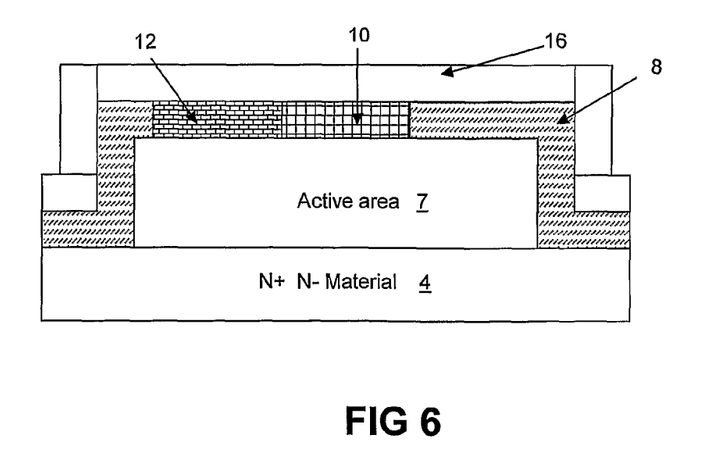
Figure 7:
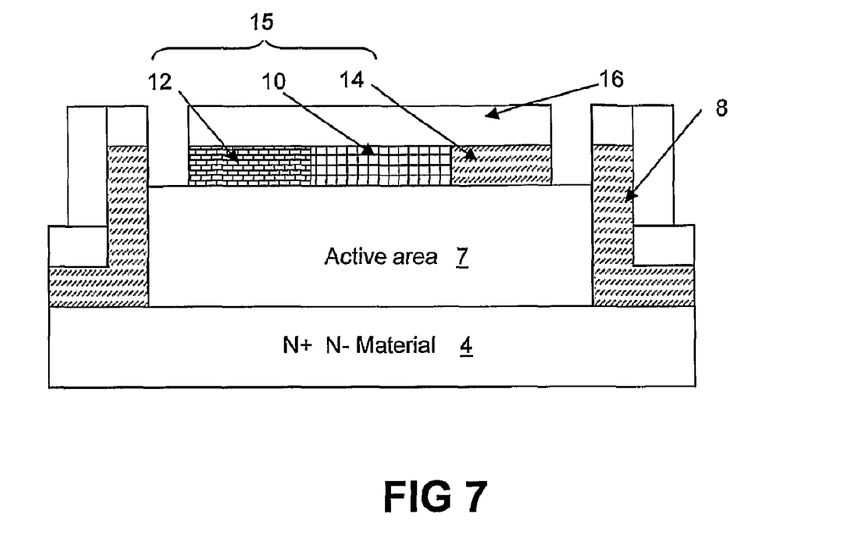

Next, as shown in FIG. 6, a cap layer 16 is formed over the polycrystalline semi-conductive layer 8. Cap layer 16 typically comprises at least one dielectric layer and preferably comprises an oxide/nitride/oxide (ONO) sandwich, and is typically referred to as the Inter Layer Dielectric (ILD).

The next step is a PHV mask and then etch of the ONO cap layer 16 and polycrystalline semi-conductive layer 8. This serves to define the outside dimensions of the integrated diode 15. As can be seen from FIG. 7, the integrated diode is formed from the first P+ region 12, the second N+ region 14 and the third N– region 10, located between the first and second regions.

Figure 8:
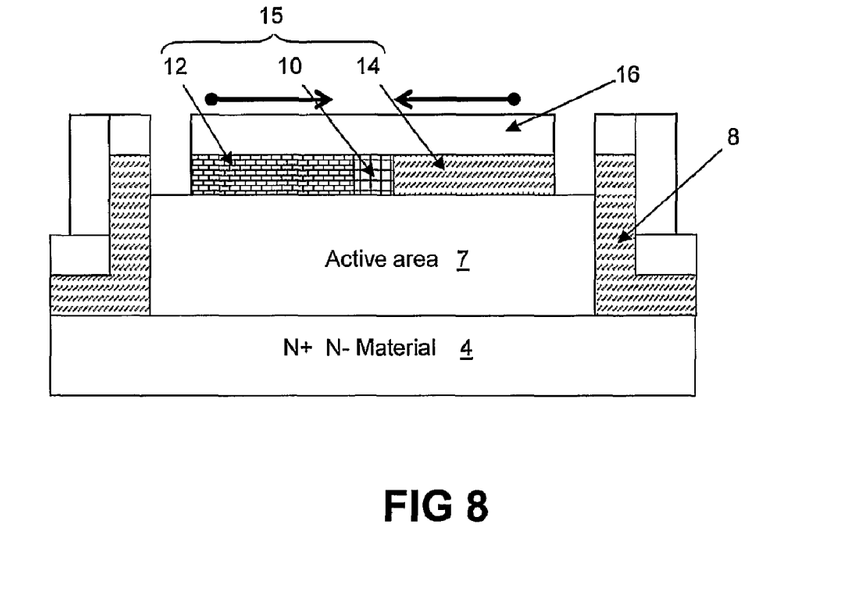

Next, a reduced time PHV drive is carried out to redistribute, by diffusion, the P and N type dopants laterally into the lightly doped central region 10 within the diode 15. This is shown in FIG. 8. During this re-distribution step, some of the P conductivity type dopant diffuses from the first region 12 into the third, central region 10, and some of the N conductivity type dopant diffuses from the second region 14 also into the third, central region 10. The first 12, second 14 and third 10 regions are adjacent one another and provide the P/N junction of the integrated temperature sensing diode 15.

The PHV drive serves to reduce the width of the lightly doped N– region 10 and results in a lowered current density within the PN junction, which, in turn, reduces the lifetime recombination within the polycrystalline semi-conductive layer 8. This results in the parameter, Vf, of the diode always being stable, which results in a more accurate temperature sensing diode 15.

To re-distribute the dopants, the device is subjected to a high temperature heat treatment, for example, the device is heated to a temperature of greater than 1000 degrees Celsius. In the preferred embodiment, the PHV drive time is reduced from a typical 130 minutes at 1080 degrees Celsius to only 80 minutes at the same temperature.

Figure 9:
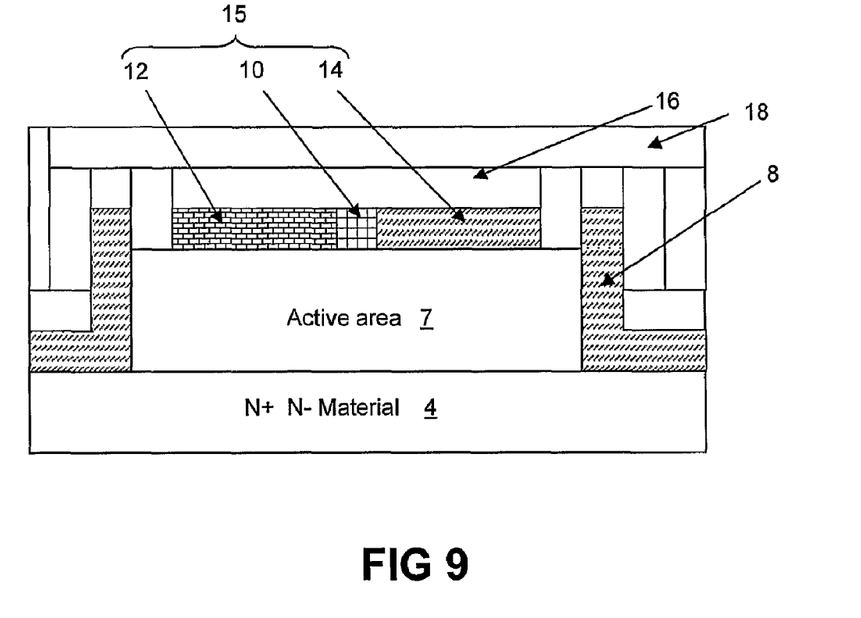

The next step, shown in FIG. 9, is to deposit a TEOS, or nitride and TEOS, layer 18 over the whole device.

Figure 10:
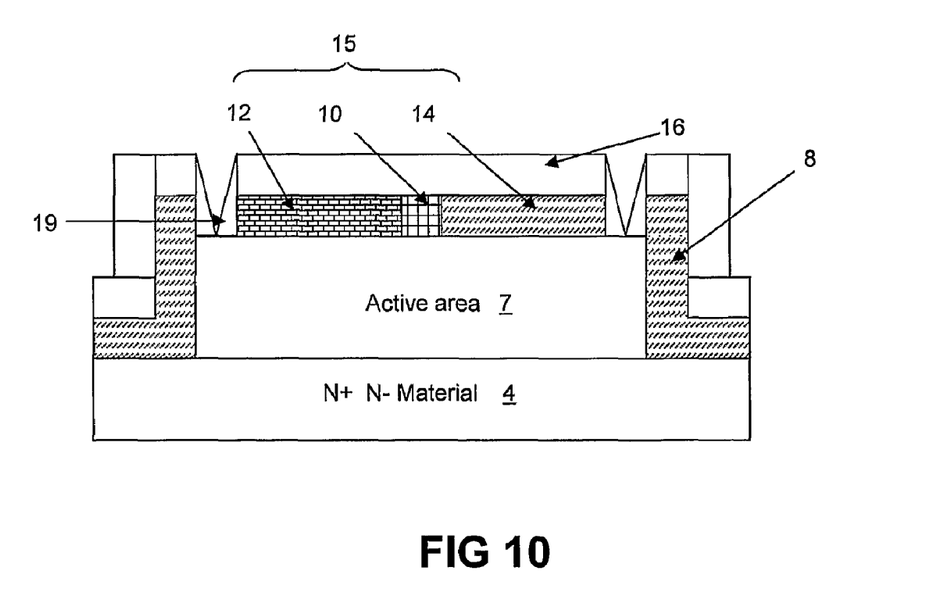

Then, as shown in FIG. 10, the TEOS layer is etched away to leave spacers 19 separating the diode 15 from the rest of the device, in particular the integrated power MOSFET, for example. The use of spacers, for separating individual components on a die, in manufacturing semiconductor devices is well known and will not be described in more detail in the present application.

The above steps describe the formation of the forward biased temperature sensing diode element 15. However, the above steps also correspond generally to the steps required to produce any PN junction. Accordingly, the below described reversed biased diode (or multiples of the same), used for electrical isolation, is formed in a similar manner to above.

The next steps relate to the metallization of the temperature sensing diode 15, and surrounding device, for both electrical and thermal conduction. In particular, the metallization steps result in the formation of the necessary contacts for the correct operation of the device, including the integrated diode. A cross section through the final end product of the metallization process can be seen in FIG. 11, which also shows the N+ source region 32 and PHV body region 34 parts of the power MOSFET 30 with which the diode is integrated, and a metal layer 20 which forms electrical to the power semiconductor device 30 and the temperature sensing diode 15 (contacts not shown in FIG. 11).

Figure 12:
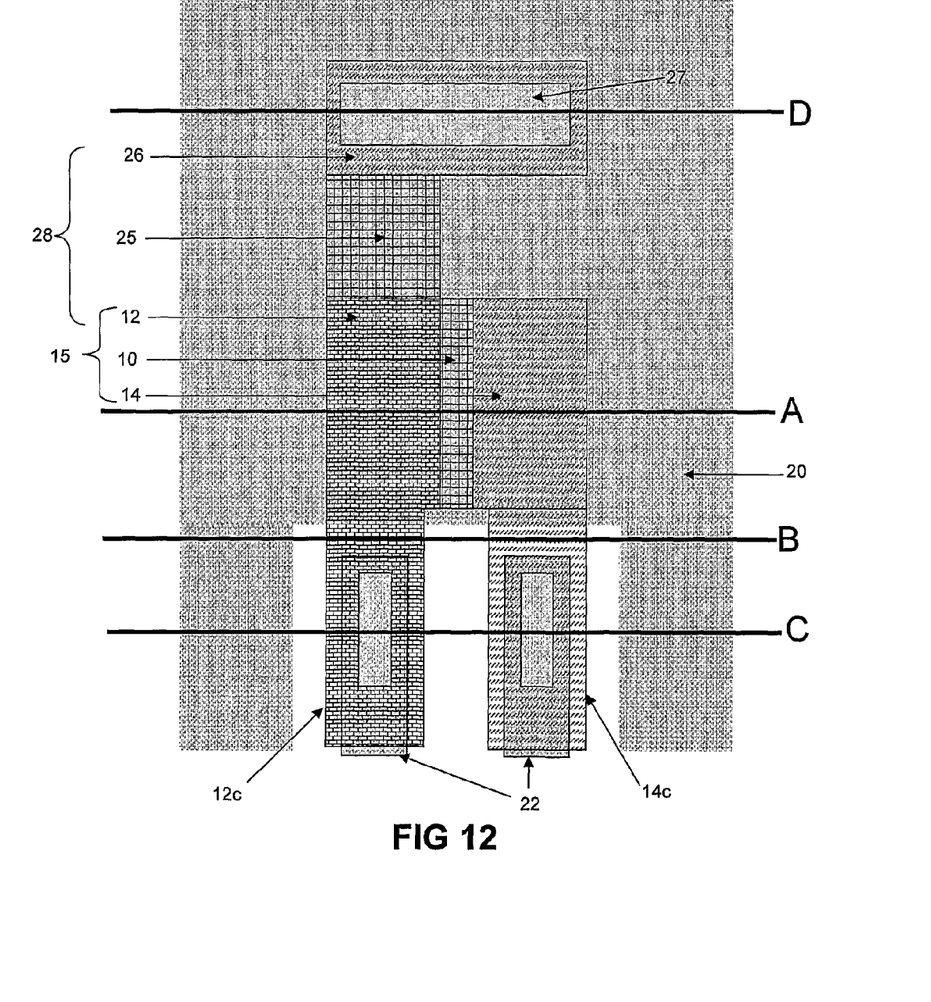
FIG. 12 shows a portion of a semiconductor device having an integrated temperature sensing diode made according to an embodiment of the present invention from a top down perspective.

However, as will be appreciated by those skilled in the art, semiconductor devices are constructed layer by layer using a variety of material deposition, mask, and etch steps, for example as described above. Therefore, whilst the above steps relate to the layered structure of the single forward biased temperature sensing diode, as seen in a cross section of the device, they do not accurately depict the location of each layer laterally across the device, nor the further parts of the device according to the present invention. In particular, the formation of a thermal contact to improve the thermal coupling between the heat generating power semiconductor device 30 and the temperature sensing diode 15 has not been described. This arrangement can be more easily seen from a top down view of a portion of the device, as shown in FIG. 12.

This further thermal contact, and the remaining metallization portion of the manufacturing process for the semiconductor device, will now be described with reference to FIGS. 12 to 20.

The integrated device in accordance with the present invention further comprises a thermal contact extending from the metal layer 20 through the cap layer 16 to a region 26 of the semi-conductive layer 8. The region 26 of the semi-conductive layer 8 is electrically isolated from the temperature sensing element 15. In order to be electrically isolated, the region 26 of the semi-conductive layer 8 is remote from the temperature sensing element 15 (in other words is not adjacent to and coupled to the temperature sensing element 15). In an embodiment, the region 26 is separated from the temperature sensing element 15 by, for example, a resistive region and/or at least one reversed P/N Junction.

The thermal contact 27 is an extension of the metal layer 20 forming an electrical contact of the power semiconductor device 30 onto the polysilicon semi-conductive layer 8 in which the temperature sensing element is located. This is done to bypass the cap layer 16 or ILD which has low thermal conductivity, and therefore improves the accuracy and the speed of detection of the temperature sensing diode 15. The thermal contact 27 is formed using an opening, or via, in the cap layer 16. This is formed using the above described mask and etch process common to semiconductor device manufacture. For example, the opening for the thermal contact 27 is formed at the same time and using the same process steps as the openings for the contacts to the power semiconductor device 30.

Meanwhile, electrical isolation is required between the thermal contact 27 and the temperature sensing diode element 15 to prevent unwanted leakage currents occurring at the high operating temperatures at which such power semiconductor devices 30 typically operate (approx 150 degrees Celsius).

The electrical isolation between the thermal contact region 26 on the semi-conductive layer 8 and the temperature sensing element 15 formed within the semi-conductive layer 8 should be such that only a small proportion of the forward current flowing through the temperature sensing element 15 flows through the semi-conductive layer to the thermal contact 27, in the form of a leakage current. In practical implementations, some leakage current will occur, however, typically this will be around 1% of the current injected into the forward biased temperature diode in use (for example, approximately 100 nA leakage current out of a typical 20 μA current injected into temperature sensing diode 15).

The electrical isolation required can be formed using a variety of methods. The preferred form is to use one or more reversed PN junctions between the thermal contact region 26 on the semi-conductive layer 8 and one electrode of the temperature sensing element, to block the current injected into the forward biased temperature sensing diode 15 for measurement purposes from flowing through to the source electrical contact 20. Each reversed PN junction may form a diode, zener diode or Thyristor. It will be appreciated that the reversed PN junction(s) may be formed using the process steps used to form the temperature sensing element 15 as described above. Alternatively, a region of very high resistance (more than several M ohms) between the thermal contact region 26 and the temperature sensing element 15 can be used. The high resistance region may be made, for example, by using very low doping levels in that region during a mask and implantation step.

In the case when one or more reversed PN junctions are used, the type and number of devices used will vary on the requirements of the circuit, in particular the operating levels of the device as a whole. This is because the breakdown voltage of a single PN junction might not be sufficient for the high voltage levels used with such power semiconductor devices. For example, where individual diodes have a break down voltage of 10V, five would be required to isolate the temperature sensing diode 15 from the source metal contact 20 in a device that operates at 50V.

The thermal contact 27 should be a predetermined distance from the temperature sensing element 15. To ensure the maximum accuracy, the thermal contact 27 should be placed as close to the temperature sensing diode 15 as possible. However, the actual distances used will be determined by the parameters of the PN junctions or resistive regions used, since the dimensions of the $P^+$, $N^+$ and $N^-$ doped regions vary according to these parameters. The number of reversed PN junctions used also determines the predetermined distance used. However, an exemplary predetermined distance would be 10 μm per reversed PN junction, therefore at 50V operating voltage the distance between the thermal contact region 26 and the temperature sensing element 15 will be 50 μm.

The exact size (width and height) of the thermal contact 27 is dependent on the requirements of the device in question. Since polysilicon typically conducts heat approximately one hundred times more efficiently than the cap layer 16, even a very small opening (for example less than 100th of the polysilicon layer 8 thickness) will result in a doubling of the thermal coupling capacity.

In more detail, FIG. 12 shows an embodiment of the present invention in which a single thermal contact 27 is made between the source metal layer 20 of the power semiconductor device 30 (the grey shaded area covering substantially all of the portion of the semiconductor device in view) and the polysilicon semi-conductive layer 8. In this embodiment, a reversed bias diode 28 is used as the electrical isolation between the temperature sensing diode 15 and the thermal contact 27.

The reversed PN junction 28 is formed from the same N+ region 12 as the temperature sensing diode 15, but also using a further $N^-$ 25 and $P^+$ region 26 also. The $P^+$ region 26 (thermal contact region 26) of the reversed PN junction is where the source metal layer 20 contacts the polysilicon. A similar mask and implant step, with similar doping levels to ensure the correct electrical contact between metal and polysilicon, is used as described earlier in relation to FIG. 4.

Equally, the $N^-$ region is formed in a similar process to that used in forming the $N^-$ region of the temperature sensing diode 15.

Figure 11:
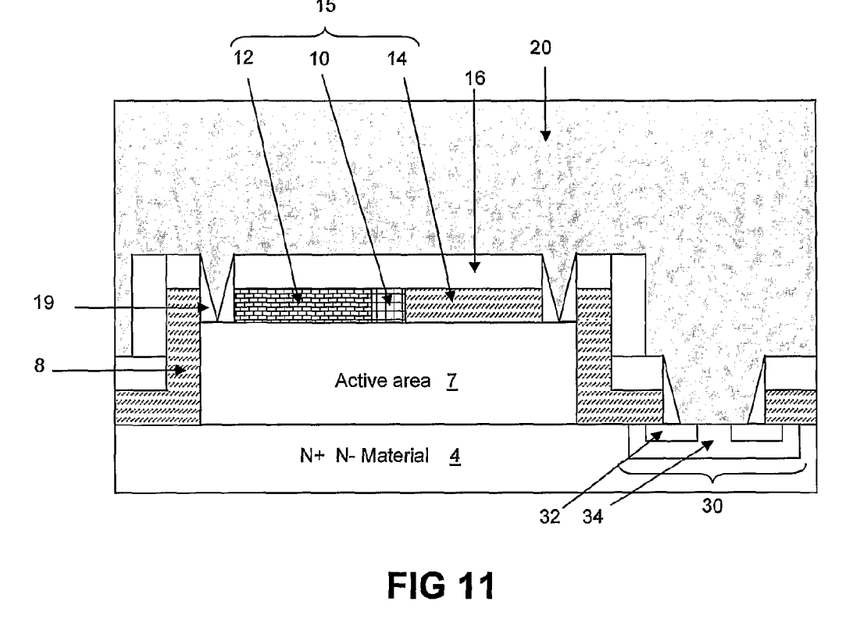

As shown previously from a side on view, i.e. cross sectional view, in FIG. 11, the PN junction of the temperature sensing diode 15 is formed from a highly doped P type conductivity implanted polycrystalline region 12 adjacent a lightly N type conductivity implanted polycrystalline semi-conductive region 10, which in turn is adjacent a highly doped N type conductivity implanted polycrystalline semi-conductive region 14.

However, as shown more clearly in FIG. 12, the two highly doped regions 12 and 14 are formed such that they have laterally extending regions, 12c and 14c respectively. These are present to allow metal contact regions 22 to be formed, to electrically connect the temperature sensing diode to the temperature sensing circuitry (not shown), either located elsewhere on the same die, else located off die and being connected through outputs on the die package. The extensions allow the actual temperature sensing PN junction to be buried underneath a metal layer 20 for example the metal layer that forms the source contact for the power MOSFET.

Optionally, the temperature sensing diode 15 may be buried under the source contact metal layer 20 of the power MOSFET, such that the temperature sensing diode 15 is located nearer to the heat generating/carrying portion of the semiconductor device. This results in an improved thermal coupling between the temperature sensing diode 15 and the heat generating power MOSFET. In the preferred embodiment, this source metal layer 20 is between 4 and 10 microns thick.

Figure 13:
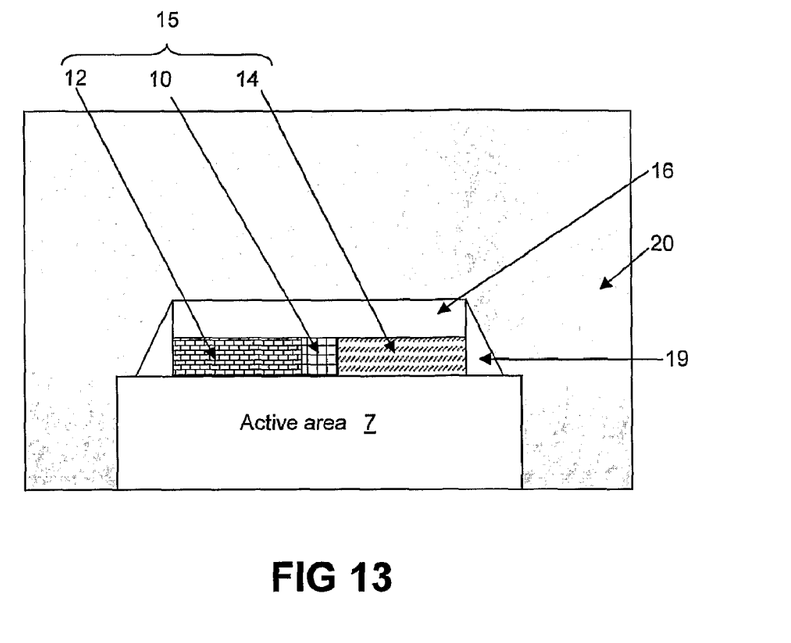
FIG. 13 shows a simplified schematic cross-sectional diagram of FIG. 12 across the line marked "A"

Turning to FIG. 13, there is shown a cross sectional view of the buried portion of the temperature sensing diode 15, across bisecting line "A" of FIG. 12. The buried portion includes the whole of the PN junction formed as described above. This view shows the spacers 19 that delimit the temperature sensing diode from the rest of the device, as well as the insulating layer, which in the preferred embodiment is the cap layer 16, on top of the temperature sensing diode's PN junction 15, to electrically isolate the temperature sensing diode 15 from the power MOSFET source contact metal layer 20.

Figure 14:
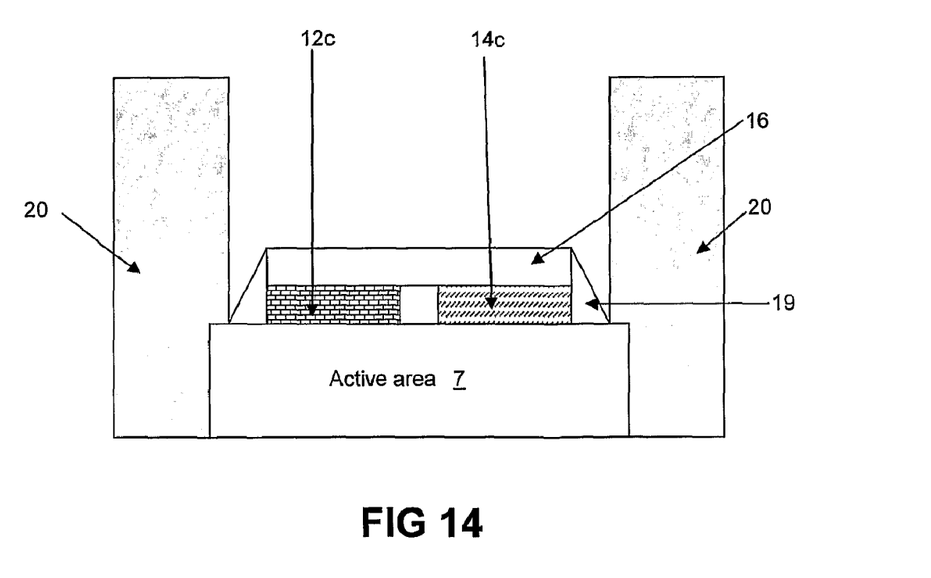
FIG. 14 shows a simplified schematic cross-sectional diagram of FIG. 12 across the line marked "B"

Now turning to FIG. 14, which shows the cross sectional view along the bisecting line "B" of FIG. 12, it can be seen that the thick power MOSFET source metal layer 20 is not connected to the two separate temperature sensing diode metal contacts 22. All three metalized areas are kept separate using the standard mask and etch steps, used to metalize semiconductor devices.

Figure 15:
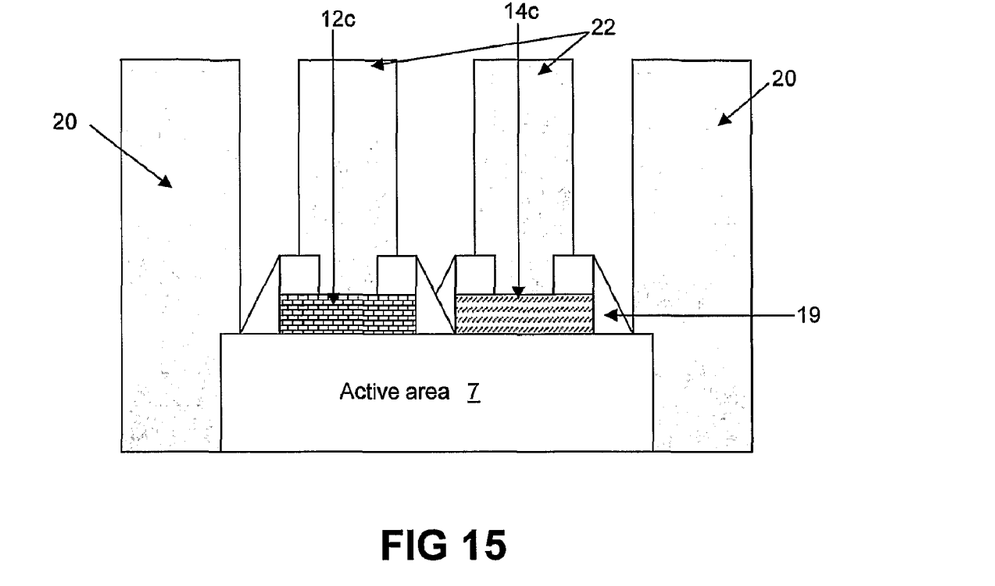
FIG. 15 shows a simplified schematic cross-sectional diagram of FIG. 12 across the line marked "C"

Turning to FIG. 15, first and second openings are formed in the cap layer 16 such that they extend to the first 12 and second 14 regions of the polycrystalline semi-conductive layer 8, respectively. Metal contacts are then formed in the first and second openings to the first 12 and second 14 regions of the semi-conductive layer to provide the temperature sensing diode contacts 22.

Figure 16:
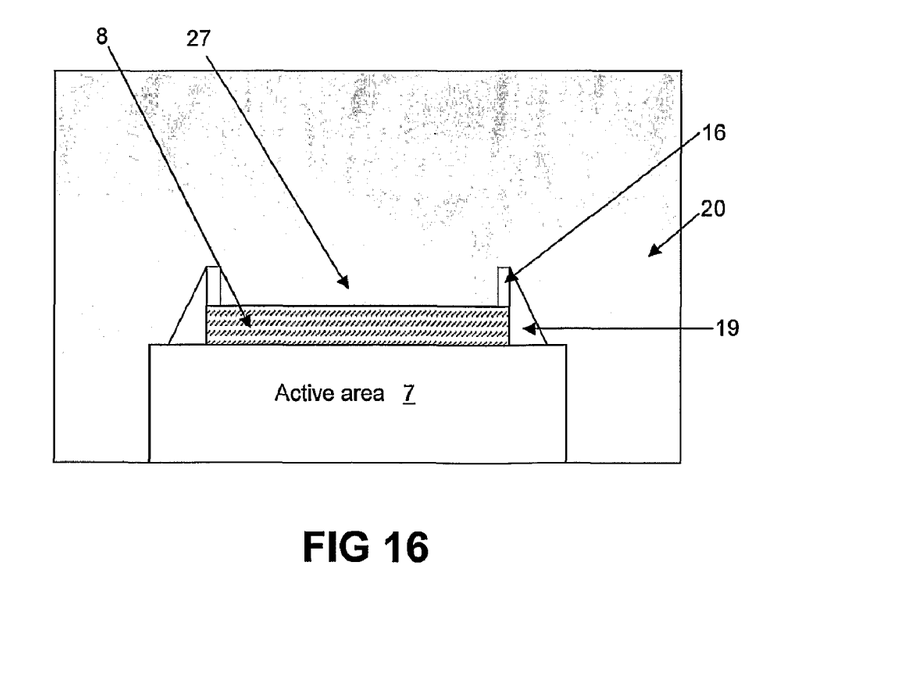
FIG. 16 shows a simplified schematic cross-sectional diagram of FIG. 12 across the line marked "D"

FIG. 16 shows the cross sectional view along the bisecting line "D" of FIG. 12, where it can be seen that the metal layer 20 forming an electrical contact 20 of the semi-conductor device 30 extends through an opening in the ILD cap layer 16 to contact the polysilicon layer 8. This is formed in a similar manner, and at a similar time, to the above described forming of the electrical contacts 22 for the temperature sensing diode 15.

Figure 17:
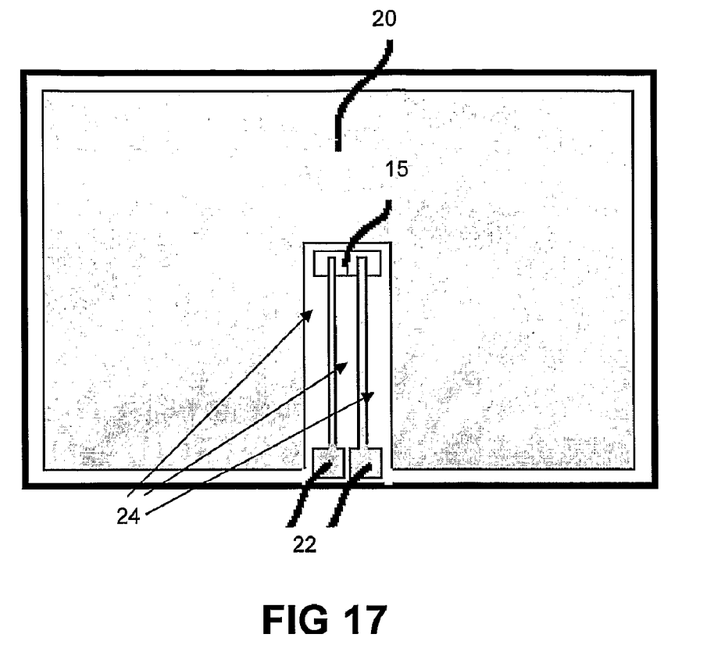
FIG. 17 shows a power MOSFET incorporating a temperature sensing diode according to the prior art.

Turning now to FIG. 17, where there is shown an integrated temperature sensing diode according to the prior art, there will now follow a description of the preferred placement of the temperature sensing diode 15 according to the present invention, including a description of the improvements in the performance of the temperature sensing diode 15 that results from the change in location of the temperature sensing diode 15.

FIG. 17 shows the traditional placement of an integrated temperature sensing diode. Since the traditional form of temperature sensing diode simply uses the conduction of heat from the active area of the power MOSFET to the diode, via the base semiconductor material, the diode must be placed as near to the active area of the power MOSFET as possible. This typically results in the temperature sensing diode being positioned in the centre of the active area, as shown.

However, in this prior art arrangement, the placement of the temperature sensing diode 15 is such that the active area of the semiconductor device is reduced. The unused area 24, resultant from leaving space to route tracks to the metal contact areas 22 of the diode, cause perturbations in the specific on resistance of the power MOSFET because it acts as a fading element.

Furthermore, despite the diode's close proximity to the heat generating portion of the power semiconductor device, due to silicon's low thermal conductivity there is still a temperature differential between the diode and the power MOSFET that reduces the accuracy of the diode.

Figure 18:
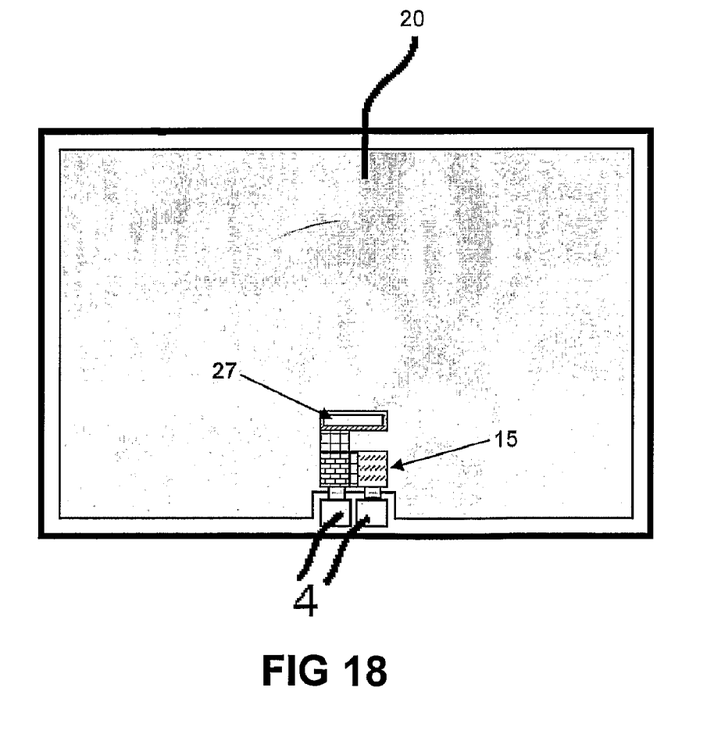
FIG. 18 shows a power MOSFET incorporating a temperature sensing diode according to the present invention.

FIG. 18 shows an integrated temperature sensing diode 15, in accordance with the present invention.

As can be see from FIG. 18, since the temperature sensing diode 15 has been moved to the edge of the device 30, less active area has been lost. Furthermore, since the heat generating power semiconductor device 30 has been thermally coupled to the polysilicon layer in which the temperature sensing diode 15 is formed, the said diode 15 is more accurate, and can react faster to changes in temperature, than those of the prior art. Therefore, the characteristics of the power MOSFET device are improved. In particular, the specific turn on resistance of the power MOSFET device is lowered.

In the example shown in FIG. 18, the temperature sensing diode 15 has also been covered by a metal layer 20 deposited over an insulating layer 16. The thickness of the metal layer 20 deposited over the diode can be anywhere between 4 and 10 microns thick, or even more in certain situations. Depositing a thin metal layer, for example 4 microns thick, allows the diode to at least react to temperature changes more rapidly, since the metal acts as a heat source/sink for the diode. If, however, a thick metal layer is used, i.e. 10 microns or more, an added benefit arises in that the diode can then be moved laterally across the device, to improve other parameters of the integrated power MOSFET. This is to say, because the diode is now thermally coupled to the power MOSFET using the more thermally conductive material, metal, it is possible to relocate the diode to one edge of the power MOSFET device. In the case of the manufacture of a integrated circuit (IC) incorporating more than one power semiconductor device, the diode may be placed on the edge of the whole die itself.

However, the temperature sensing diode 15 need not be placed under a metal layer 20 if this is not suitable for the particular application. This is because, although the metal layer 20 provides additional thermal coupling, which is beneficial, where it is important to use less metal in the electrical contact, or for other layout reasons, the metal layer 20 can be arranged such that it does not cover the temperature sensing diode 15. In this case, the thermal coupling achieved by the thermal contact extension 27 through to the polysilicon is sufficient.

Figure 19:
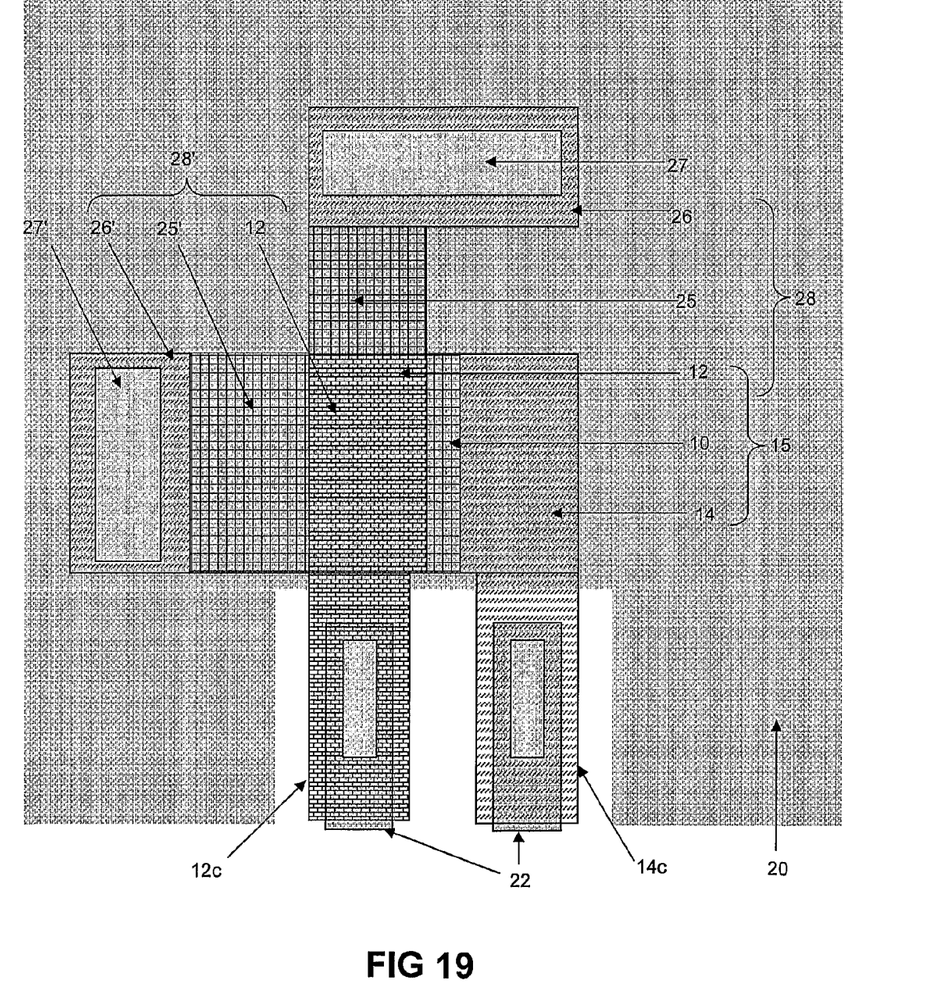
FIG. 19 shows a portion of a semiconductor device having an integrated temperature sensing diode made according to an alternative embodiment of the present invention from a top down perspective, in which multiple thermal contacts are used.

Turning now to FIG. 19, there is shown an embodiment of the present invention in which there are two thermal contacts 27 used, each separated by a reversed diode (28/28'). The addition of further thermal contacts 27 between the electrical contact 20 of the semiconductor 30 and the semi-conductive layer within which the temperature sensing diode 15 is formed may be used to further improve the detection characteristics of the device. In the above case, where no source metal layer covers the temperature sensing diode 15 due to layout reasons, the additional thermal contact can offset the thermal coupling lost.

Figure 20:
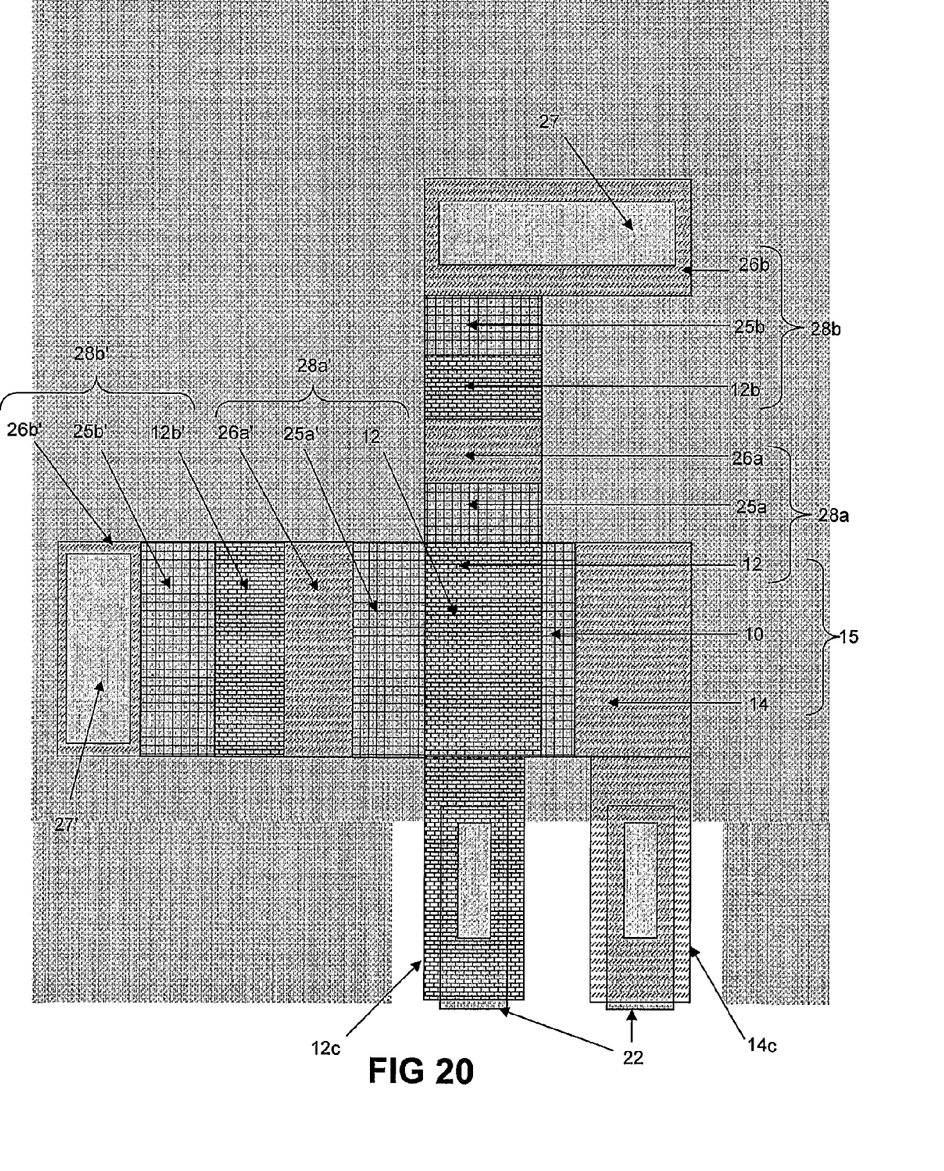
FIG. 20 shows a portion of a semiconductor device having an integrated temperature sensing diode made according to a further alternative embodiment of the present invention from a top down perspective, in which both multiple thermal contacts and multiple reversed diodes are used.

FIG. 20 shows an embodiment of the present invention in which there are multiple thermal contact points 27, each electrically isolated from the temperature sensing diode element 15 by use of multiple (in this case two) diodes (28a/b, 28a'/b'). As mentioned previously, multiple reversed PN junctions are used to allow the device to operate at the require high voltage levels.

In other embodiments of the present invention, the thermal contact(s) 27 may only extend through a substantial part of (and not all the way through) the insulation layer 16. In this case, the reversed PN junction may be omitted due to the resistance of the remaining portion of the insulation layer 16. The portion of the insulation layer that is left in place should be thick enough such that it still provides sufficient electrical isolation. Multiples of these substantially, but not totally, extended thermal contacts may be used also.

Further, a thinner layer of insulation material 16 may be used over the temperature sensing element, in order to provide improved thermal coupling, and therefore improve accuracy of the temperature sensing device 15.

In the embodiments where some insulation layer 16 remains (i.e. is not totally etched away), additional mask and etch steps may be required.

By utilising a thermal contact to thermally couple a contact of the semiconductor device to the semi-conductive layer within which the temperature sensing element is formed, whilst electrically insulating/isolating the same thermal contact from the temperature sensing element, the temperature sensing element can more accurately and quickly determine the temperature of the semiconductor device. This is because the otherwise highly insulating (both thermally and electrically) Inter layer dielectric cap layer is bypassed, and the heat generated by the power semiconductor device is conducted through the metal layer forming a contact of the semiconductor device directly to the semi-conductive layer containing the temperature sensing element.

Further, by above described adaptation, the two active areas are sufficiently thermally coupled together to allow the temperature sensing element to be placed at the boundary of the semiconductor device, or indeed, the edge of a whole die incorporating a number of semiconductor devices, which is typical in power MOSFETS. This in turn allows the specific turn on resistance of the associated semiconductor device to be reduced. At the same time, the semiconductor device incorporating the temperature sensing element of the present invention exhibits an improved temperature sensing ability, in both terms of accuracy and speed of detection.

The invention has been described above starting with a blanket N conductivity type implantation step followed by an P conductivity type implantation step into the semi-conductive layer 8. Alternatively, an P conductivity type blanket implantation step could be used followed by a N conductivity type implantation step into the semi conductive layer. Good ohmic contacts are required between the first 12 and second 14 regions of the semi-conductive layer 8 and the contacts 22. To ensure a good ohmic contact a higher concentration of N dopant is needed in the N type region compared to the concentration of P dopant in the P type region.

Whilst the above description has concentrated on the formation of a temperature sensing diode 15 only, it will be apparent to the skilled person that the above steps can form part of a larger process to form a semiconductor device having an integrated temperature sensing diode. As, for example, shown in U.S. Pat. No. 6,773,977. The final resultant integrated device can be seen in FIG. 11.

Also, whilst the above uses a power MOSFET device as the example power semiconductor device, it would also be apparent to a person skilled in the art that other semiconductor devices may also benefit from practicing the invention, for example, Insulated Gate Bipolar Transistors (IGBTs), microelectromechanical systems (MEMS), sensors, and the like. The described temperature sensing device may also be incorporated into integrated circuits, to more accurately sense the temperature of the integrated circuit as a whole.

As the skilled person will realise, the alternative embodiments of the invention presented herein are able to be combined as far as their operation is not mutually exclusive.

The invention claimed is:

1. An integrated device, comprising:
   a semiconductor device formed on a semiconductor substrate;
   a temperature sensing element formed within a semi-conductive layer formed on the semiconductor substrate;
   an electrically insulating layer formed over the semi-conductive layer; and
   a metal layer formed over the insulation layer and forming an electrical contact of the semiconductor device;
   a thermal contact extending from the metal layer substantially through the electrically insulating layer adjacent to a first region of the semi-conductive layer, wherein the first region of the semi-conductive layer is electrically isolated from the temperature sensing element.

2. The device of claim 1, further comprising between the first region and the temperature sensing element any one of:
   a resistive region; and
   at least one reversed P/N junction.

3. The device of claim 2, wherein the at least one reversed P/N junctions forms any one of:
   a diode;
   a zener diode; and
   a thyristor.

4. The device of claim 1, wherein the metal layer substantially covers the semiconductor device and the temperature sensing element.

5. The device of claim 1, wherein the temperature sensing element is formed on an outside edge of a die containing the semiconductor device.

6. The device of claim 1, wherein the metal layer is at least 4 microns thick.

7. The device of claim 1, wherein the thermal contact comprises a portion of the metal layer extending through an opening in the electrically insulating layer.

8. The device of claim 1, further comprising a plurality of thermal contacts extending from the metal layer through the electrically insulating layer to a plurality of regions of the semi-conductive layer, wherein each of the plurality of regions is electrically isolated from the temperature sensing element.

9. The device of claim 8, wherein the plurality of thermal contacts surround the temperature sensing element.

10. A method of forming a temperature sensing element for integration with a semiconductor device, comprising the steps of:
    providing a semiconductor substrate;
    forming a semiconductor device on said semiconductor substrate;
    forming a temperature sensing element within a semi-conductive layer on said semiconductor substrate;
    forming an electrically insulating layer over said semi-conductive layer; and
    forming a metal layer over the electrically insulating layer, wherein the metal layer forms an electrical contact of the semiconductor device;
    forming a thermal contact extending from the metal layer through the electrically insulating layer to a first region of the semi-conductive layer, wherein the first region of the semi-conductive layer is remote from the temperature sensing element and electrically isolated from the temperature sensing element.

11. The method of claim 10, wherein the step of forming the thermal contact further comprises the step of:
    forming an opening in the electrically insulating layer extending to the semi-conductive layer; and
    depositing metal over the electrically insulating layer such that the metal layer extends through the opening to the semi-conductive layer.

12. The method of claim 10, further comprising the step of forming between the first region and the temperature sensing element, any one of:
    a resistive region; and
    at least one reversed P/N junction.

13. The method of claim 10, wherein the step of forming the metal layer further comprising forming the metal layer such that the metal layer substantially covers the semiconductor device and the temperature sensing element.

14. The method of claim 10, wherein the step of forming the temperature sensing element further comprises locating the temperature sensing element on an outside edge of a die containing the semiconductor device.

15. The method of claim 10, wherein the metal layer is at least 4 microns thick.

16. The method of claim 10, further comprising the step of forming a plurality of thermal contacts extending from the metal layer through the electrically insulating layer to a plurality of regions of the semi-conductive layer, wherein each of the plurality of regions electrically isolated from the temperature sensing element.

17. The method of claim 16, further comprising the step of locating the plurality of thermal contacts such that they surround the temperature sensing element.

* * * * *